United States Patent [19]

Pascucci

[11] Patent Number: 5,859,810
[45] Date of Patent: Jan. 12, 1999

[54] PULSE GENERATION CIRCUIT AND METHOD FOR SYNCHRONIZED DATA LOADING IN AN OUTPUT PRE-BUFFER

[75] Inventor: Luigi Pascucci, Sesto San Giovanni, Italy

[73] Assignee: SGS-Thomson Microelectronics S.r.l., Agrate Brianza, Italy

[21] Appl. No.: 826,009

[22] Filed: Mar. 27, 1997

[30] Foreign Application Priority Data

Mar. 29, 1996 [EP] European Pat. Off. .............. 96830169

[51] Int. Cl.⁶ .................................................. G11C 13/00
[52] U.S. Cl. ................................. 365/230.01; 365/230.06
[58] Field of Search ......................... 365/189.01, 189.05, 365/230.01, 230.06, 230.08

[56] References Cited

U.S. PATENT DOCUMENTS

| | | | |
|---|---|---|---|
| 4,797,573 | 1/1989 | Ishimoto | 307/269 |
| 4,858,197 | 8/1989 | Aono et al. | 365/233 |
| 4,908,796 | 3/1990 | Lee et al. | 365/189 |
| 5,018,111 | 5/1991 | Madland | 365/233 |

FOREIGN PATENT DOCUMENTS

A-0 469 247  2/1992  European Pat. Off. .......... G11C 7/00
A-0 526 433  2/1993  European Pat. Off. .......... G11C 7/00

*Primary Examiner*—Terrell W. Fears
*Attorney, Agent, or Firm*—Wolf, Greenfield & Sacks, P.C.

[57] ABSTRACT

A memory device that includes an internal bus for the transfer of data and reporting signals from and to the memory and output pre-buffers for the transfer of data to output terminals of said memory, a pulse generation circuit for the synchronized loading of data in an output pre-buffer. Additional circuitry is provided that includes a synchronization circuit; a transmission path delay reproduction circuit for reproducing the propagation delays of the data transmitted to the output terminals; and a pre-buffer delay reproduction circuit for reproducing the propagation delays of the output pre-buffers. The synchronization circuit is adapted to synchronize the generation of at least one pulse that is synchronized with the propagation delays reproduced by the transmission path delay reproduction circuit, and the pulse is adapted to enable the loading of the data in the output pre-buffers. The synchronization of the pulse is provided as a consequence of the assured presence of the data, and the synchronous pulse is restored after a time that is equal to the delay introduced by the pre-buffer delay reproduction circuit for reproducing the propagation delays of the output pre-buffers, so as to update the configuration of the output pre-buffers in the time interval determined by the synchronous pulse.

38 Claims, 2 Drawing Sheets

PULSE GENERATION CIRCUIT AND METHOD FOR SYNCHRONIZED DATA LOADING IN AN OUTPUT PRE-BUFFER

BACKGROUND OF THE INVENTION

1. Field of the Invention

The present invention relates to a pulse generation circuit and method for data loading in an output pre-buffer, particularly for memory devices.

2. Discussion of the Related Art

It is known that in a memory device the data present inside the memory device must, during the reading step, be transferred to output terminals of the memory device to make the data available to the outside world. Usually, the output terminals are not directly connected to the memory matrix, however, the output terminals present to the outside world the data related to the last reading operation performed on the memory device.

When a reading operation is performed, it is therefore necessary to activate the connecting path between the the memory matrix and the output terminals for data transmission.

A drawback that can often be observed is that noise, which is either present on the supply lines or generated by the switching of the memory outputs, may be superimposed on the data that has just been transmitted. Also, the noise may possess oscillatory characteristics which further interfere with the transmitted data.

When the data is loaded into an output pre-buffer, pre-buffer switches and assumes the mode dictated by the data. Once the data has been loaded into the output pre-buffer for discharge onto the output terminal, any other possible switching (not produced by an actual address transition) that occurs at the input node of the pre-buffer is associated with a new data reading operation, can undesirably alter the configuration of pre-buffer, thus corrupting the data produced by the reading operation.

By introducing an internal bus into the architecture of a memory device, a problem of determining the right moment for synchronization of the data arriving from the memory matrix, over the internal bus is created. Also, the operation of the internal bus must be transparent to external devices.

SUMMARY OF THE INVENTION

One aim of the present invention is therefore to provide a pulse generation circuit for the synchronized loading of data in an output pre-buffer, particularly for memory devices, that allows to generate pulses that are synchronized with the production and natural propagation of the data, for the subsequent loading of the data into the output pre-buffer without additional delays.

Within the scope of this aim, an object of the present invention is to provide a pulse generation circuit for the synchronized loading of data in an output pre-buffer, particularly for memory devices, that allows to inhibit the modification of the output pre-buffer in the shortest possible time, so as to prevent noise from adding to the data.

Another object of the present invention is to provide a pulse generation circuit for the synchronized loading of data in an output pre-buffer that allows to link the minimum duration of the pulse to the various power supply, technology, and temperature conditions that occur.

Another object of the present invention is to provide a pulse generation circuit for the synchronized loading of data in an output pre-buffer that allows to control the minimum duration of the generated pulses that ensures the certain configuration of the output pre-buffer.

Another object of the present invention is to provide a pulse generation circuit for the synchronized loading of data in an output pre-buffer in which the duration of the pulses is strictly limited to the time for loading the data in the output pre-buffer.

Another object of the present invention is to provide a pulse generation circuit for the synchronized loading of data in an output pre-buffer that allows to maintain a decoupling between the internal bus and the memory matrix device, so as to preserve bus independence.

Another object of the present invention is to provide a pulse generation circuit for the synchronized loading of data in an output pre-buffer that allows to generate the pulses asynchronously for data loading operations that do not require a full reading cycle.

Another object of the present invention is to provide a pulse generation circuit for the synchronized loading of data in a pre-buffer that allows to provide a mode for the forced generation of the loading pulses.

Another object of the present invention is to provide a pulse generation circuit for the synchronized loading of data in an output pre-buffer, particularly for non-volatile memories, that allows to generate a plurality of pulses.

Another object of the present invention is to provide a pulse generation circuit for the synchronized loading of data in an output pre-buffer, particularly for non-volatile memories, that allows to preset the duration of the pulses so as to closely match the loads and impedances of the data propagation path.

Significantly, the present invention provides a circuit that is highly reliable and relatively easy to produce at competitive costs.

This aim, these objects, and others that will become apparent hereinafter are achieved by a pulse generation circuit for the synchronized loading of data in an output pre-buffer, comprising a synchronization generation circuit; a transmission path delay reproduction circuit which reproduces the propagation delays of the data transmitted to said output terminals; and a pre-buffer delay reproduction which reproduces the propagation delays of the output pre-buffers. The synchronization circuit is adapted to synchronize the generation of at least one pulse that is synchronized with the propagation delays reproduced by the transmission path delay reproduction circuit, the pulse being adapted to enable the loading of the data in the output pre-buffers. The synchronization of the pulse is provided as a consequence of the assured presence of the data, the synchronous pulse being restored after a time that is equal to the delay introduced by the pre-buffer delay reproduction circuit, so as to update the configuration of the output pre-buffers in the time interval determined by the synchronous pulse.

BRIEF DESCRIPTION OF THE DRAWINGS

Further characteristics and advantages of the invention will become apparent from the description of a preferred but not exclusive embodiment of the circuit according to the invention, illustrated only by way of non-limitative example in the accompanying drawings, wherein.

DETAILED DESCRIPTION

Figure 1:
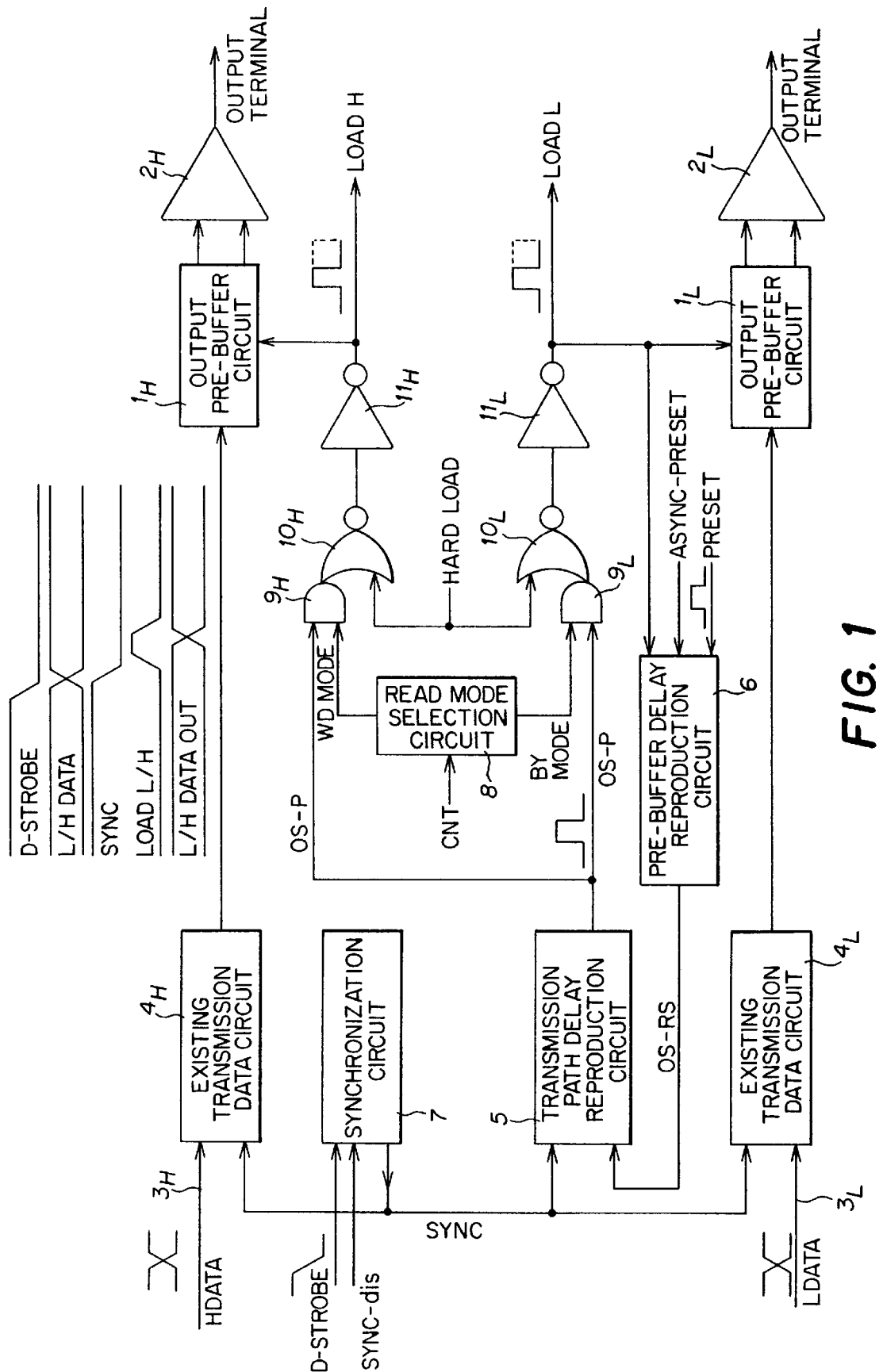
FIG. 1 is a block diagram of the circuit according to the invention.

With reference to the figures, the circuit according to the invention includes a storage device, advantageously constituted by latch structures that form output pre-buffers $1_L$ and $1_H$. The latch structures are connected to output buffers that constitute the output terminals $2_L$ and $2_H$.

Due to the symmetry of the circuit, since a memory matrix divided into two half-matrices L and H is being considered, only the portion of the circuit that relates to the connecting path between the internal bus that carries the data of the half-matrix L and the output terminals $2_L$ is described for the sake of simplicity in description. Identical reference numerals are assigned to identical elements in the two identical circuit portions.

As mentioned, therefore, the internal bus $3_L$ carries the data from the memory matrix (not shown) to the "outside world" for the reading of the data.

The path followed by the data is characterized by intrinsic delays, represented by the circuits $4_L$.

Said data path delays are reproduced by transmission path delay reproduction circuit 5 (which are provided once for both circuit portions H and L).

The intrinsic delays of the output pre-buffers $1_L$ and $1_H$ are instead reproduced by pre-buffer delay reproduction circuit 6 for reproducing the delays of the output pre-buffers $1_H$ and $1_L$. In this case, also, the pre-buffer delay reproduction circuit 6 is provided once for both circuit portions H and L.

The circuit also comprises a synchronization circuit 7 that is adapted to synchronize short pulses, referenced as LOAD pulses, with the appearance of the data to load the data present on the internal bus in the output pre-buffers $1_L$ and $1_H$.

The block diagram of FIG. 1 is completed by a read mode selector circuit 8 which selects the word or byte read mode.

In detail, the various functional blocks shown in FIG. 1 are mutually connected as follows.

The synchronization circuit 7 receives an input signal D-STROBE that is adapted to determine the moment that is adapted for data sampling and synchronization of the synchronization pulses LOAD (since the signal D-STROBE is also a signal for capturing the matrix data item).

The synchronization circuit 7 also receives an input signal for disabling/enabling the pulses LOAD and emit in output a synchronization signal SYNC.

The synchronization signal SYNC is sent to the circuit $4_L$, which determines the delay of the path for the transmission of the data to the output pre-buffer $2_L$, and to a transmission path delay reproduction circuit 5 for reproducing the delays of the transmission path. The transmission path delay reproduction circuit 5 emits a signal OS-P for producing the synchronous pulse LOAD, which is in turn sent respectively to logic control devices 9, 10, and 11.

The logic control devices comprise two AND logic gates $9_H$ and $9_L$ that receive as their other input, in addition to the signal OS-P, a signal WDmode and a signal BYmode, respectively, that originate from the read mode select circuit or as is 8. The signal WDmode indicates selection of the data path for the half-matrix H, whereas the signal BYmode indicates selection of the data path for the half-matrix L.

The read mode selection circuit 8 receives an input control signal CNT that indicates the desired type of selection (word or byte).

The output of the AND logic gates $9_H$ and $9_L$ is sent respectively to two NOR logic gates $10_H$ and $10_L$ that receive, as their other input, a signal for producing pulses asynchronously (forced pulse production mode). This signal is designated as HARD LOAD.

The outputs of the logic gates $10_H$ and $10_L$ are sent respectively through two inverters $11_H$ and $11_L$ for generating the pulses $LOAD_H$ and $LOAD_L$ for synchronously loading the data in the output pre-buffers $1_H$ and $1_L$ respectively.

The pulse $LOAD_L$ is fedback to the pre-buffer delay reproduction circuit 6 for reproducing the delays of the output pre-buffers. The pre-buffer delay reproduction circuit 6 also receives two additional signals: a signal PRESET, which is adapted to preset the condition for generating the pulse LOAD that is produced at the appropriate time; and a signal ASYNC-PRESET that allows to preset the generation of a pulse LOAD, which however in this case is asynchronous and has immediate propagation. The output of the pre-buffer reproduction circuit 6 is a signal OS-RL or restoring the line for generating the pulses LOAD.

Figure 2:
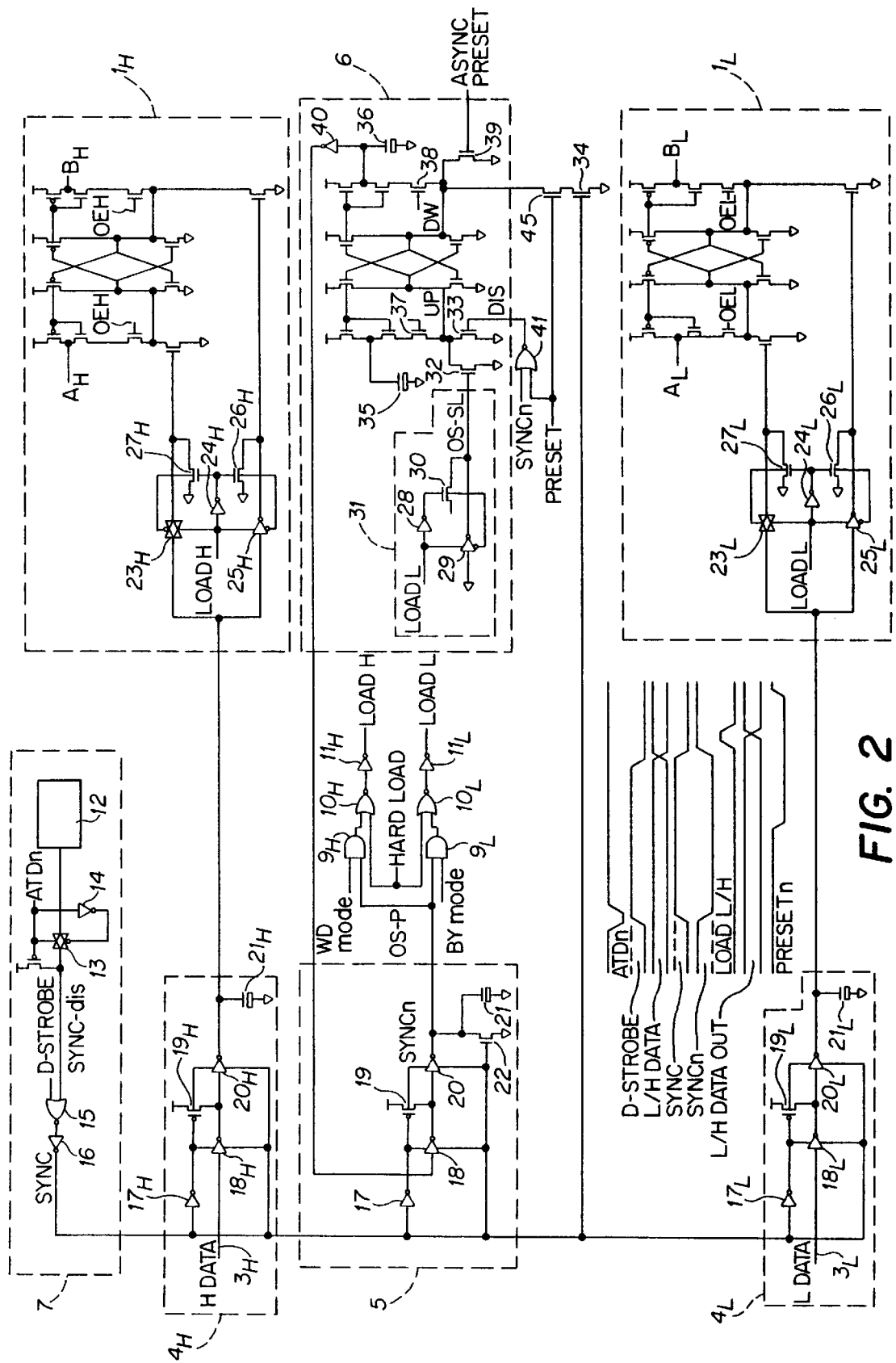
FIG. 2 is a circuit diagram of a detail of the circuit according to the invention, shown in FIG. 1.

The circuit diagram of FIG. 2 represents an embodiment of the present invention which performs the functions of the block diagram of FIG. 1.

The synchronization circuit 7 comprises in detail a device 12 for generating a synchronization control signal SYNC-CNT. This synchronization control signal is sent to a pass transistor 13 that is constituted by a P-type transistor and by an N-type transistor.

An inverted memory read address transition signal ATDn is sent in input to an inverter 14, whose output is the input on the gate terminal of the P-type transistor of the pass transistor 13. The signal ATDn is also sent in input to the gate terminal of the N-type transistor of the pass transistor 13 and to the gate terminal of an additional P-type transistor that is interposed between the supply and the output of the pass transistor 13, which constitutes the synchronization disabling signal SYNC-dis.

The signal SYNC-dis, together with the signal D-STROBE (explained earlier), is sent in input to a NOR logic gate, whose output passes through an inverter 16.

The output of the inverter 16 is the signal SYNC.

With reference now in detail to the existing delay circuit $4_L$ for reproducing the delays of the path for the propagation of the data toward the output buffers $1_L$, said circuit comprises a first inverter $17_L$, which receives in input the synchronization signal SYNC, and a second inverter $18_L$, which receives in input the data that are present on the internal bus $3_L$ and is interposed between the output of the inverter $17_L$ and the inverted signal SYNC.

A P-type transistor $19_L$ is interposed between the supply voltage and the output of the inverter $18_L$ and receives in input at its gate terminal the output of the inverter $17_L$.

A third inverter $20_L$ is cascade-connected to the inverter $18_L$ and receives in input the inverted signal SYNC.

A capacitor $21_L$ connected between the output of the inverter $20_L$ and the ground represents the capacitance of the path for transmitting the data to the output terminals $2_L$.

The above described existing delay circuit $4_L$ represents the delay that affects the data that are present on the internal bus $3_L$ as a consequence of their transmission to the output terminals $2_L$.

The transmission path delay reproduction circuit $5_L$ represents the reproduction of the delay and is therefore constituted by the same elements as the circuit $4_L$ (and of the circuit $4_H$), which are assigned the same reference numerals but without the addition of any suffix. Since the two circuits are identical, in order to avoid redundancies in the explanation the circuit 5 will not be explained in detail.

With respect to the circuit $4_L$, the transmission path delay reproduction circuit 5 additionally includes an N-type transistor 22 that is connected between the output of the inverter 20 and the ground and receives the signal SYNC at its gate terminal.

The logic devices 9, 10, and 11 respectively for the half-matrices H and L, which are cascade-connected to the transmission path delay reproduction circuit 5, have already been described with reference to FIG. 1.

The logic gates $9_H$ and $9_L$ receive respectively in input the signals for selecting the read mode (word or byte), designated by WDmode for selecting word-type reading and by BYmode for selecting the byte-type read mode.

The output pre-buffers $1_L$ and $1_H$ include the actual storage devices, which are constituted by latch circuits, and a circuit for driving the latch circuits.

The driving circuit is constituted by a pass transistor $23_L$, by two inverters $24_L$ and $25_L$, and by two N-type transistors $26_L$ and $27_L$.

The driving circuit receives input data that is present on the internal bus in addition to the synchronization pulse LOADL for loading the data in the output pre-buffers $1_L$.

An output enabling signal OEL is indicated in the latch structure of the output pre-buffer circuit $1_L$ (likewise, there is a similar signal OEH for the output pre-buffer circuit $1_H$).

The lines designated by $A_L$ and $B_L$ represent the connection to a P-type transistor and to an N-type transistor, respectively, of the output terminals $2_L$.

The pre-buffer delay reproduction circuit 6 therefore comprises a latch structure that is similar to the one shown with reference to the output pre-buffer circuit $1_L$. As regards the pre-buffer delay reproduction circuit 6, two nodes of the latch, designated by UP and DW, are indicated.

The reproduction of the driving circuit 31, is constituted by two inverters 28 and 29 and by a transistor 30 that are connected as shown in FIG. 2 (the connection is similar to the one shown for the driving circuit related to the output pre-buffer circuit $1_L$). The inverter 29 is connected to the ground.

The reproduced driving circuit 31 therefore has, with respect to the actual driving circuit, a pass transistor and one transistor less, since they are not necessary for propagation.

The driving circuit 31 receives as input the synchronization pulse LOADL and emits as output the signal OS-SL, which is fed to the gate terminal of a transistor 32 of the N-type that is part of the reproduced latch structure, which is similar to the latch structure of the output pre-buffer circuit $1_L$.

An additional N-type transistor 33 is interposed between the node UP of the latch structure and the ground.

A signal DIS is sent to the gate terminal of the transistor 33 and originates from latch enabling logic control circuit, which comprise a NOR logic gate 41, whose two inputs are constituted by the inverted synchronization signal SYNCn and by the signal PRESET, both of which have been described above.

The signal PRESET is sent to the gate terminal of an N-type transistor 45 that is interposed between the node DW of the latch structure and an additional transistor 34 of the N type that receives as input, at its gate terminal, the synchronization signal SYNC.

The transistor 34 is interposed between the transistor 33 and the ground.

Capacitors 35 and 36 are included in the latch structure as shown in FIG. 2 to represent the capacitance of the P- and N-type transistors, respectively, of the output terminals $2_L$ (not shown in FIG. 2).

The output enabling signals OE are not sent to the gate terminals of the transistors 37 and 38 of the reproduced latch structure, as occurs instead for the latch structure of the output pre-buffer circuit $1_L$, but the gate terminals are connected to the supply voltage.

An N-type transistor 39 is instead connected between the node DW of the latch structure and the ground, in a symmetrical position with respect to the transistor 32. The signal ASYNC-PRESET is sent to the gate terminal of the transistor 39.

Finally, an inverter 40 connected as shown in FIG. 2 is inserted on the feedback line that carries the signal OS-RL to the inverter 18 that belongs to the transmission path delay reproduction circuit 5.

To summarize, the control lines of the circuit according to the invention include essentially the following:
  a) SYNC-dis: controls the disabling/enabling of the pulses LOAD (L/H) for loading the data of the memory, which are present on the internal bus, in the output pre-buffers $1_L$ and $1_H$;
  b) ATDn and SYNC-CNT: together, they determine the duration of the pulses LOAD;
  c) D-STROBE: a sensing signal that determines the moment that is adapted for the sampling of the data and the synchronization of the pulses LOAD;
  d) PRESET: allows to preset the condition of the pulse LOAD that will be produced at the appropriate time;
  e) ASYNC-PRESET: like PRESET, it allows to preset the condition of the pulse LOAD, but asynchronously and with immediate propagation;
  f) HARD LOAD: allows to produce pulses asynchronously, with immediate propagation and with any duration. It is used for example during inspection of the memory device.

With reference to the above figures, the operation of the circuit according to the invention is as follows.

For the circuit according to the invention it is possible to identify various steps, each of which is characterized by a particular configuration of the various signals of the circuit (high state or low state).

Let us consider first of all the disabling step, during which the possibility to produce synchronization pulses for loading the data in the output pre-buffers $1_L$ and $1_H$ is inhibited.

During this step, only forced pulses HARD-LOAD are possible for inspection of the memory device, as explained previously.

This disabling step is characterized in that the signal DIS that leaves the NOR logic gate 41 is high; this entails that the node UP of the latch structure is low, and in this manner the entire latch structure is blocked and no loading of the data present on the internal bus occurs.

In detail, during this disabling step the various signals that are present in the circuit according to the invention assume the following states:

SYNC-CNT=1

SYNC-dis=1 (by means of SYNC-CNT=1)

SYNC=1

SYNCn=0

D-STROBE=0

OS-P=0

PRESET=0
DIS=1
UP=0
DW=1
OS-SL=0
OS-RL=0

As a consequence of a variation of the address transition detection signal ATD, which indicates the need to read the memory matrix, a step for generating synchronous pulses is entered; this step is divided into three steps:

* a presetting step, which is characterized in that it has the following conditions for the various signals of the circuit:
    SYNC-CNT=0
    SYNC-dis=1 (by means of the signal ATDn)
    SYNC=1
    SYNCn=0
    D-STROBE=1
    OS-P=0
    PRESET=1
    DIS=0
    UP=1
    DW=0
    OS-SL=0
    OS-RL=1

During this presetting step, the conditions that allow to produce the pulses LOAD at the appropriate time are set;

* a step for generating synchronous pulses, characterized in that it has the following conditions for the various signals of the circuit:
    SYNC-CNT=0
    SYNC-dis=0
    SYNC=0
    SYNCn=1
    D-STROBE=0
    OS-P=1
    PRESET=1
    DIS=0 -UP=1
    DW=0
    OS-SL=0
    OS-RL=1

During this step, the pulses LOADH related to the half-matrix H (if the corresponding control signal WDmode is 1) and the pulses LOADL are produced;

* a step for restoring the pulses LOAD, characterized in that it has the following conditions for the various signals of the circuit:
    SYNC-CNT=0
    SYNC-dis=0
    SYNC=0
    SYNCn=1
    D-STROBE=0
    OS-P=0
    PRESET=1
    UP=0
    DW=1
    OS-SL=1
    OS-RL=0

In this manner, the pulses LOADL and LOADH are self-reset and cannot be produced again until a new cycle is started; this cycle is always established by the signal D-STROBE that is meant to trigger the entire timing.

In order to generate the data loading pulses, it is also possible to produce an asynchronous pulse, i.e., a pulse that is independent of the data propagation delays on the output path when a full memory read cycle is not to be performed, for example in the case in which one is in the byte read mode and therefore the data that is present on the internal bus related to the half-matrix H is rerouted on the internal bus related to the half-matrix L so as to be loaded in the output pre-buffers $1_L$ and then sent to the output terminals $2_L$. The asynchronous pulse is produced by the signal ASYNC-PRESET, which becomes high. The asynchronous pulse has a shorter duration than the synchronous pulse LOAD.

Finally, there is an inactive step that is characterized in that it has the same conditions as the disabling step, except for the following signals:
    SYNC-CNT=0
    SYNC-dis=0 (by means of SYNC-CNT=0)
    SYNC=0
    SYNCn=1
    DIS=0

This step occurs, for example, at the end of a memory read or in any case when the memory device still has to begin a reading operation.

The charts of the timings of the various signals shown in FIGS. 1 and 2 visually summarize the above listed behaviors.

Therefore, to summarize, as a consequence of the signal D-STROBE that switches from high to low and activates the entire subsequent timing, the signal SYNC also switches from high to low and the data present on the internal bus, designated by L/H DATA, are acquired with certainty by the internal bus for transmission to the output terminals $2_L$ and $2_H$.

Simultaneously with the switching of the data, the signal SYNC is produced; this signal switches from high to low, triggering, at its falling edge, the generation of the pulses LOAD L/H that have a short duration and are synchronous with the data, since the delays of the propagations of the data along the transmission path have been taken into account (with the means 5) for the synchronous and timed loading of the data in the output pre-buffers $1_L$ and $1_H$.

The loading of the data in the pre-buffers is indicated by the signal referenced by L/H DATA OUT, which switches within the duration of the pulse.

Then the pulse, which is formed by repeating the same delays as the output pre-buffers $1_H 1_L$, is restored to zero and cannot be reproduced until a new cycle, timed by the signal ATD that varies and by the signal D-STROBE, begins.

In practice it has been observed that the circuit according to the invention fully achieves the intended aim, since it allows to produce a synchronized pulse by repeating the propagation of the data along the path for transmission to the output pre-buffers for loading the data in said pre-buffers, thus avoiding any further delay, regardless of the operating voltages, of the temperature, and of the technological parameters.

The pulse is immediately reset once loading has been performed, in order to avoid harmful interference on the data caused by noise.

The step for restoring the pulse to zero is also performed by taking into account the data propagation delays in the output pre-buffers and therefore intrinsically determines a duration thereof that truly matches the propagation of a correct loading. This duration is minimized and this property is conserved regardless of the operating condition and of the technology.

Therefore, the data in the pre-buffer are modified only in extremely short time intervals, marked by the synchronous pulses, so as to avoid alterations thereof. The duration of the pulses is thus closely linked to the loads and to the impedance of the paths that the data must perform for reading from the memory.

Furthermore, it is possible to produce pulses asynchronously for data loads that do not require a full memory read cycle.

The possibility of producing a forced asynchronous pulse allows to perform a whole series of memory inspection operations, reading the auxiliary reporting data rerouted on the internal bus; in this case, the duration of the pulse can be changed at will without being tied to the propagations of the data of the memory along the transmission paths. Finally, it should be noted that it is possible to produce a plurality of synchronous pulses.

The plurality of synchronous pulses is always generated by a single simulation of the paths for the propagation of the data toward the output terminals and of the propagations of the output pre-buffers.

The circuit thus conceived is susceptible of numerous modifications and variations, all of which are within the scope of the inventive concept; all the details may furthermore be replaced with other technically equivalent elements.

In practice, the materials employed, so long as they are compatible with the specific use, as well as the dimensions, may be any according to the requirements and the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A memory device including a memory matrix;
    an internal bus for the transfer of data and reporting signals from and to the memory matrix;
    output pre-buffers for the transfer of data to output terminals of the memory matrix; and
    a pulse generation circuit for the synchronized loading of data in an output pre-buffer, further comprising:
        synchronization generation means;
        means for reproducing the propagation delays of the data transmitted to said output terminals; and
        means for reproducing the propagation delays of said output pre-buffers; said synchronization means being adapted to synchronize the generation of at least one pulse that is synchronized with the propagation delays reproduced by said data propagation delay reproduction means, said pulse enabling the loading of the data in said output pre-buffers, said synchronization being provided as a consequence of the assured presence of the data, said synchronous pulse being restored after a time that is equal to the delay introduced by said means for reproducing the propagation delays of the output pre-buffers, so as to update the configuration of said output pre-buffers in the time interval determined by said synchronous pulse.

2. The memory device according to claim 1, wherein said means for reproducing the propagation delays of the data transmitted to the output terminals structurally reproduce the configuration of the paths for the transfer of the data to the output terminals, so as to match the delays of the data transmitted to said output terminals.

3. The memory device according to claim 1, wherein said means for reproducing the propagation delays of the output pre-buffers structurally reproduce the configuration of the output pre-buffers so as to match the delays of the data transmitted to said output terminals.

4. The memory device according to claim 1, wherein said means for reproducing the propagation delays of the data transmitted to the output terminals receive in input a synchronization signal that is produced by said synchronization generation means, said synchronization signal being also sent in input to the path for the transmission of data to the output terminals.

5. The memory device according to claim 4, wherein said synchronization signal is fedback to said means for reproducing the propagation delays of said output pre-buffers.

6. The memory device according to claim 5, wherein said means for reproducing the propagation delays of said output pre-buffers receive in input a signal for asynchronously presetting said at least one pulse and a signal for presetting the condition for generating said at least one pulse, the output of said means for reproducing the propagation delays of said output pre-buffers being sent as input to said means for reproducing the propagation delays of the data transmitted to said output terminals.

7. The memory device according to claim 1, further comprising means for selecting the read mode of said memory, said means emitting a read mode selection signal.

8. The memory device according to claim 1, wherein it comprises logic control means for generating said at least one pulse, said logic means being controlled by the output of said means for reproducing the delays in the propagation of the data to said output terminals.

9. The memory device according to claim 8, wherein said logic control means comprise, in cascade, at least one AND gate, a NOR gate, and an inverter.

10. The memory device according to claim 9, wherein said AND gate receives as input the output of said means for reproducing the delays in the propagation of the data toward said output terminals and said read mode selection signal.

11. The memory device according to claim 9, wherein said NOR logic gate receives in input the output of said AND gate and a signal for producing said pulse asynchronously, the output of said NOR gate being sent through an inverter for subsequent transmission of said pulse to said output pre-buffers to enable loading of the data therein.

12. The memory device according to claim 11, wherein said signal for producing said pulse asynchronously produces pulses of a freely selected duration.

13. The memory device according to claim 1, wherein said synchronization generation means comprise driving means that receive in input an inverted read address transition detection signal and a synchronization control signal, and logic means which emits said synchronization signal to generate said pulses for loading the data in said output pre-buffers.

14. The memory device according to claim 13, wherein said driving means of said synchronization means comprise an inverter, a pass transistor, and a P-type transistor.

15. The memory device according to claim 13, whererin said logic means of said synchronization means comprise a NOR gate with a cascade-connected inverter.

16. The memory device according to claim 15, wherein said NOR gate receives as input a signal for disabling/enabling said pulses and a data sampling signal, said data sampling signal indicating the moment of acquisition of said data.

17. A memory device including a memory matrix; an internal bus for the transfer of data and reporting signals from and to the memory matrix;
    output pre-buffers for the transfer of data to output terminals of the memory matrix; and a pulse generation circuit for the synchronized loading of data in an output pre-buffer, further comprising a synchronization circuit; a transmission path delay reproduction circuit which reproduces propagation delays of the data transmitted to said output terminals; and a pre-buffer delay reproduction circuit which reproduces the propagation delays of said output pre-buffers; said synchronization circuit synchronizes the generation of at least one pulse that is synchronized with the propagation delays reproduced by said transmission path reproduction circuit, said pulse enabling the loading of the data in said output pre-buffers, said synchronization being provided as a consequence of the assured presence of the data, said synchronous pulse being restored after a time that is equal to the delay introduced by said means for reproducing the propagation delays of the output pre-buffers, so as to update the configuration of said output pre-buffers in the time interval determined by said synchronous pulse.

18. The device according to claim 17, wherein said transmission path delay reproduction circuit structurally reproduces the configuration of the paths for the transfer of the data to the output terminals, so as to match the delays of the data transmitted to said output terminals.

19. The device according to claim 17, wherein said pre-buffer delay reproduction circuit structurally reproduces the configuration of the output pre-buffers so as to match the delays of the data transmitted to said output terminals.

20. The device according to claim 17, wherein said transmission path delay reproduction circuit receives an input synchronization signal that is produced by said synchronization circuit, said synchronization signal being also sent in input to the path for the transmission of data to the output terminals.

21. The device according to claim 20, wherein said synchronization signal is fedback to said pre-buffer delay reproduction circuit.

22. The device according to claim 21, wherein said pre-buffer delay reproduction circuit receives an input signal for asynchronously presetting said at least one pulse and a signal for presetting the condition for generating said at least one pulse, the output of said pre-buffer delay reproduction circuit being sent as input to said transmission path delay reproduction circuit.

23. The device according to claim 17, further comprising a read mode selection circuit which selects the read mode of said memory and outputs a read mode selection signal.

24. The device according to claim 17, wherein it comprises logic control circuitry for generating said at least one pulse, said logic circuitry being controlled by the output of said transmission path delay reproduction circuit.

25. The device according to claim 24, wherein said logic control circuitry comprises, in cascade, on at least one AND gate, a NOR gate, and an inverter.

26. The device according to claim 24, characterized in that said AND gate receives as input the output of said transmission path delay reproduction circcuit and said read mode selection signal.

27. The device according to claim 24, wherein said NOR logic gate receives in input the output of said AND gate and a signal for producing said pulse asynchronously, the output of said NOR gate being sent through an inverter for subsequent transmission of said pulse to said output pre-buffers to enable loading of the data therein.

28. The device according to claim 27, wherein said signal for producing said pulse asynchronously produces pulses of a freely selected duration.

29. The device according to claim 17, wherein said synchronization circuit further comprises a driving circuit that receives as input an inverted read address transition detection signal and a synchronization control signal, and logic circuitry which emits said synchronization signal to generate said pulses for loading the data in said output pre-buffers.

30. The device according to claim 29, characterized in that said driving circuit of said synchronization circuit comprises an inverter, a pass transistor, and a P-type transistor.

31. Circuit according to claim 29, characterized in that said logic means of said synchronization means comprise a NOR gate with a cascade-connected inverter.

32. Circuit according to claim 31, characterized in that said NOR gate receives as input a signal for disabling/enabling said pulses and a data sampling signal, said data sampling signal indicating the moment of certain acquisition of said data.

33. A method for loading the data of a memory matrix, during a step for reading the memory, in an output pre-buffer to send the data to output terminals, particularly for non-volatile memories, comprising the steps of:

a) as a consequence of a read address transition of said memory, and of the acquisition of the data on an internal bus of said memory, presetting the conditions for the generation of at least one pulse that is synchronous with the propagation of the data;

b) generating said at least one synchronous pulse to enable the loading of said data in said output pre-buffers;

c) loading said data in said output pre-buffers; and d) resetting said at least one synchronous pulse to inhibit further variations of the data loaded in said output pre-buffers.

34. The method according to claim 33, wherein the step for generating said at least one synchronous pulse comprises the correlation of the generation of said pulse to the data propagation delays on the paths for transmission to said output pre-buffers.

35. The method according to claim 33, wherein the step for resetting said at least one synchronous pulse is performed by correlating said resetting to the data propagation delays in said output pre-buffers, in order to allow assured loading of the data in said output pre-buffers.

36. The method according to claim 33, wherein at least one synchronous pulse has a duration that is strictly limited to the time for loading the data in said output pre-buffers.

37. The method according to claim 33, further comprising a step for generating an asynchronous pulse for operations for loading data in said output pre-buffers that do not require an entire read cycle.

38. The method according to claim 33, further comprising a step for generating a forced pulse for reading reporting signals that are rerouted onto the internal bus of said memory, said forced pulse being asynchronous.

* * * * *